United States Patent
Long et al.

(10) Patent No.: US 10,640,374 B2
(45) Date of Patent: May 5, 2020

(54) METHOD AND STRUCTURE OF ATTACHMENT LAYER FOR REDUCING STRESS TRANSMISSION TO ATTACHED MEMS DIE

(71) Applicant: DunAn Microstaq, Inc., Austin, TX (US)

(72) Inventors: Wayne C. Long, Austin, TX (US); Joseph L. Nguyen, Austin, TX (US)

(73) Assignee: Dunan Microstaq, Inc., Austin, TX (US)

( * ) Notice: Subject to any disclaimer, the term of this patent is extended or adjusted under 35 U.S.C. 154(b) by 1 day.

(21) Appl. No.: 15/896,796

(22) Filed: Feb. 14, 2018

(65) Prior Publication Data

US 2018/0334382 A1    Nov. 22, 2018

Related U.S. Application Data

(60) Provisional application No. 62/507,882, filed on May 18, 2017.

(51) Int. Cl.
*G01L 9/00* (2006.01)
*G01L 19/14* (2006.01)
(Continued)

(52) U.S. Cl.
CPC ............ *B81C 3/001* (2013.01); *B81B 7/0048* (2013.01); *G01L 19/147* (2013.01); *B81B 2201/0264* (2013.01); *B81C 2203/035* (2013.01)

(58) Field of Classification Search
CPC . B81C 3/001; B81C 2203/035; B81B 7/0048; B81B 2201/0264; G01L 19/148; G01L 19/147; H01L 2924/10158; H01L 2224/48137; H01L 2224/49175; H01L 2224/73265; H01L 2224/48091;
(Continued)

(56) References Cited

U.S. PATENT DOCUMENTS 4,976,813 A    12/1990 Salensky et al.
5,050,034 A *   9/1991 Hegner ................. G01L 9/0075
                                                              177/210 C
(Continued)

FOREIGN PATENT DOCUMENTS

EP          0844809 A2    5/1998

*Primary Examiner* — Brian Turner
(74) *Attorney, Agent, or Firm* — MacMillan, Sobanski & Todd, LLC

(57) ABSTRACT

A method of attaching a MEMS die to a base includes selecting an attachment material (x), determining a maximum acceptable change in pressure due to mounting stress (dPtarget) transmitted to a MEMS die, determining a worst-case pressure difference transfer function of the attachment material (x) over a thickness (h) variation of the attachment material (x) using the equation: $dPmax_x = h*B_x + C_x$, wherein B=pressure variation/thickness (h), and C=pressure variation, substituting dPtarget for $dPmax_x$ in the pressure difference transfer function and solving the equation for h, wherein $h = (dPtarget - C_x)/B_x$, and attaching the MEMS die to a base using the selected attachment material (x) having at least the calculated thickness (h).

10 Claims, 5 Drawing Sheets

(51) Int. Cl.
G01L 19/04 (2006.01)
G01L 9/04 (2006.01)
G01L 9/06 (2006.01)
H01L 21/50 (2006.01)
B81C 3/00 (2006.01)
B81B 7/00 (2006.01)

(58) Field of Classification Search
CPC ... H01L 2924/15151; H01L 2924/1461; H01L 2924/00014; H01L 2924/00
See application file for complete search history.

(56) References Cited

U.S. PATENT DOCUMENTS

| | | | |
|---|---|---|---|
| 5,581,226 A * | 12/1996 | Shah | G01L 19/0084 338/42 |
| 6,127,713 A * | 10/2000 | Takeuchi | G01L 19/147 257/419 |
| 6,351,996 B1 * | 3/2002 | Nasiri | G01L 19/0038 73/706 |
| 9,140,613 B2 | 9/2015 | Arunasalam et al. | |
| 2004/0200286 A1 * | 10/2004 | Mast | G01L 19/0084 73/715 |
| 2011/0005326 A1 * | 1/2011 | Bentley | G01L 19/148 73/754 |
| 2011/0317863 A1 * | 12/2011 | Inoda | H04R 19/04 381/369 |
| 2012/0042734 A1 * | 2/2012 | Wade | G01L 9/0052 73/862.381 |
| 2012/0118480 A1 * | 5/2012 | Paik | C09J 5/06 156/73.1 |
| 2016/0076960 A1 * | 3/2016 | Sato | B21K 21/12 73/723 |
| 2016/0169758 A1 * | 6/2016 | Hooper | B81B 7/0061 73/717 |
| 2016/0273989 A1 * | 9/2016 | Brida | G01L 19/04 |
| 2016/0358890 A1 * | 12/2016 | Heinrich | H01L 23/49562 |
| 2017/0363499 A1 * | 12/2017 | Kroker | G01L 19/0627 |
| 2018/0274999 A1 * | 9/2018 | Konno | H01L 23/00 |

* cited by examiner

METHOD AND STRUCTURE OF ATTACHMENT LAYER FOR REDUCING STRESS TRANSMISSION TO ATTACHED MEMS DIE

BACKGROUND OF THE INVENTION

This invention relates in general to a Micro Electro Mechanical Systems (MEMS) die. In particular, this invention relates to an improved method for attaching the MEMS die to a mounting surface that provides an attachment layer between the MEMS die and the mounting surface and that reduces the transmission of stress to the MEMS die.

According to a known method, solder paste or a solder preform is placed onto a mounting surface, such as a pedestal of a valve, fluid control device, fluid system parameter sensing device, and the like. A MEMS die is then placed onto the solder paste or the solder preform and the solder paste or the solder preform is heated in a re-flow operation.

During attachment of the MEMS die, such as a MEMS die configured as a MEMS fluid pressure sensor, to a mounting surface, mechanical stress may be generated and transmitted to the MEMS fluid pressure sensor. Such mechanical stress may adversely affect the MEMS fluid pressure sensor's performance.

For example, the MEMS fluid pressure sensor may use a Wheatstone bridge strain gauge. Such a MEMS fluid pressure sensor may have a chamber with a flexible wall that deforms in response to fluid pressure in the chamber, thus producing strain. In this context, strain is the response of a system to an applied stress. When a material is loaded with a force, it produces stress, which may then cause the material to deform. As used herein, engineering strain is defined as the amount of deformation in the direction of the applied force divided by the initial length of the material. The strain gauge senses this deformation, and generates an output signal representative of the fluid pressure in the pressure chamber.

In one conventional device, the MEMS fluid pressure sensor is soldered to the mounting surface of the device body or base, and the base then threaded into a housing, such as a Schrader valve housing. As the base is tightened into the housing, applied torque may generate non-transitory stress in the base that is transmitted through the solder to the MEMS fluid pressure sensor, such that the strain gauge detects a strain and will erroneously report a fluid pressure when no fluid pressure is present in a pressure chamber of the MEMS fluid pressure sensor.

Thus, it would be desirable to provide an improved method for attaching a MEMS die to a mounting surface that reduces the transmission of stress to the MEMS die.

SUMMARY OF THE INVENTION

This invention relates to an improved method for attaching a MEMS die to a mounting surface that provides an attachment layer between the MEMS die and the mounting surface and that reduces the transmission of stress to the MEMS die.

A method of attaching a MEMS die to a base includes selecting an attachment material (x), determining a maximum acceptable change in pressure due to mounting stress (dPtarget) transmitted to a MEMS die, determining a worst-case pressure difference transfer function of the attachment material (x) over a thickness (h) variation of the attachment material (x) using the equation: $dPmax_x = h \cdot B_x + C_x$, wherein B=pressure variation/thickness (h), and C=pressure variation, substituting dPtarget for $dPmax_x$ in the pressure difference transfer function and solving the equation for h, wherein $h = (dPtarget - C_x)/B_x$, and attaching the MEMS die to a base using the selected attachment material (x) having at least the calculated thickness (h).

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
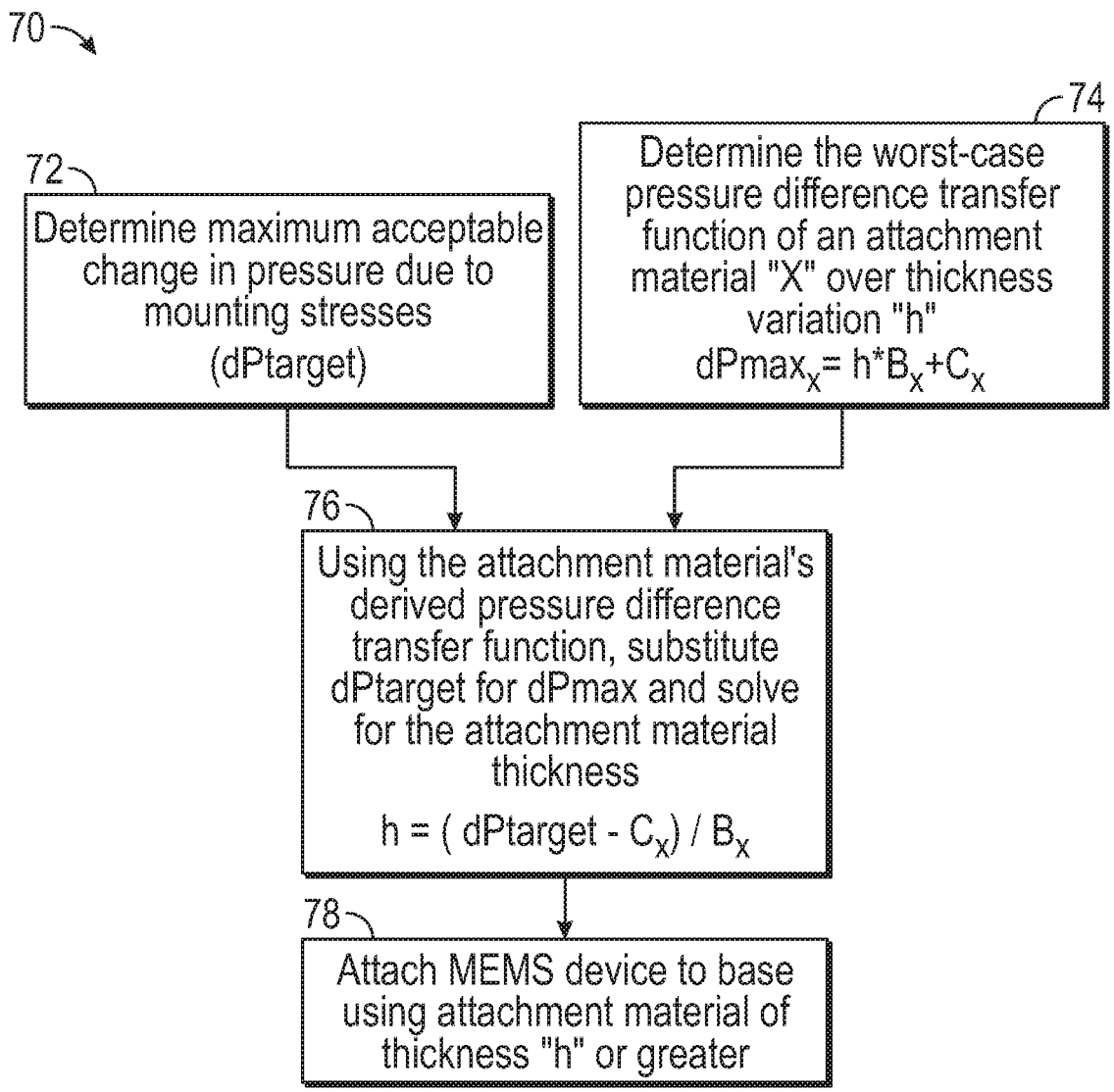
FIG. 1 is a flow chart showing the improved method according to this invention.

Referring now to the drawings, there is shown at 70 in FIG. 1 a flow chart illustrating the method according to the invention. The method 70 may be applied to a MEMS die and a body to which the MEMS die may be mounted. In the embodiments illustrated and described herein, the MEMS die is configured as a pressure sensor die 46, described in detail below, and is mounted to a body or base defining a fluid inlet member 40.

Figure 2:
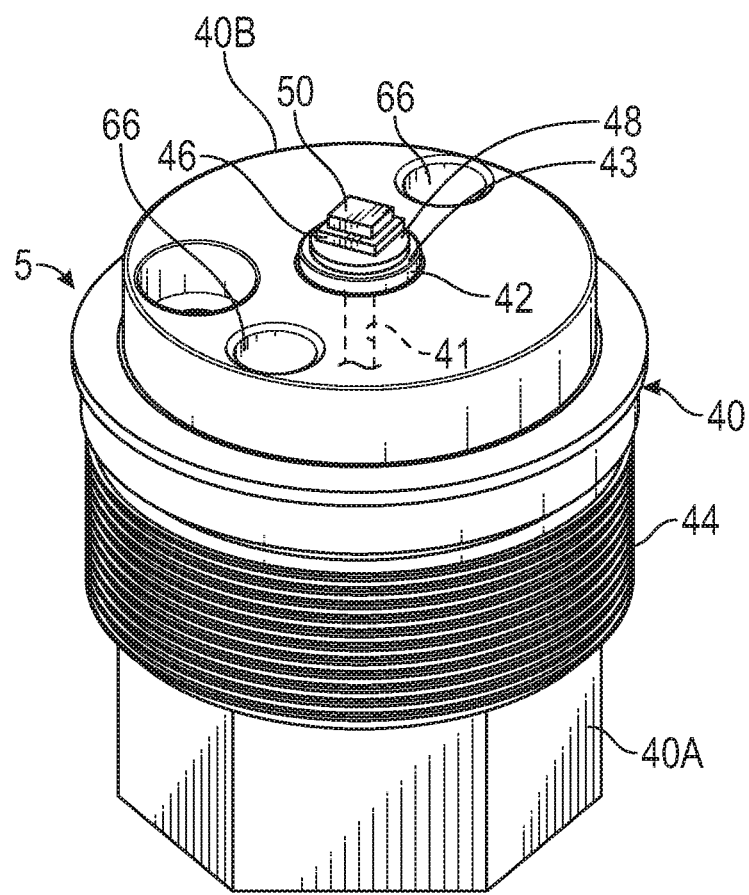
FIG. 2 is a perspective view of a portion of a superheat controller to which the method according to the invention may be applied.
Figure 5:
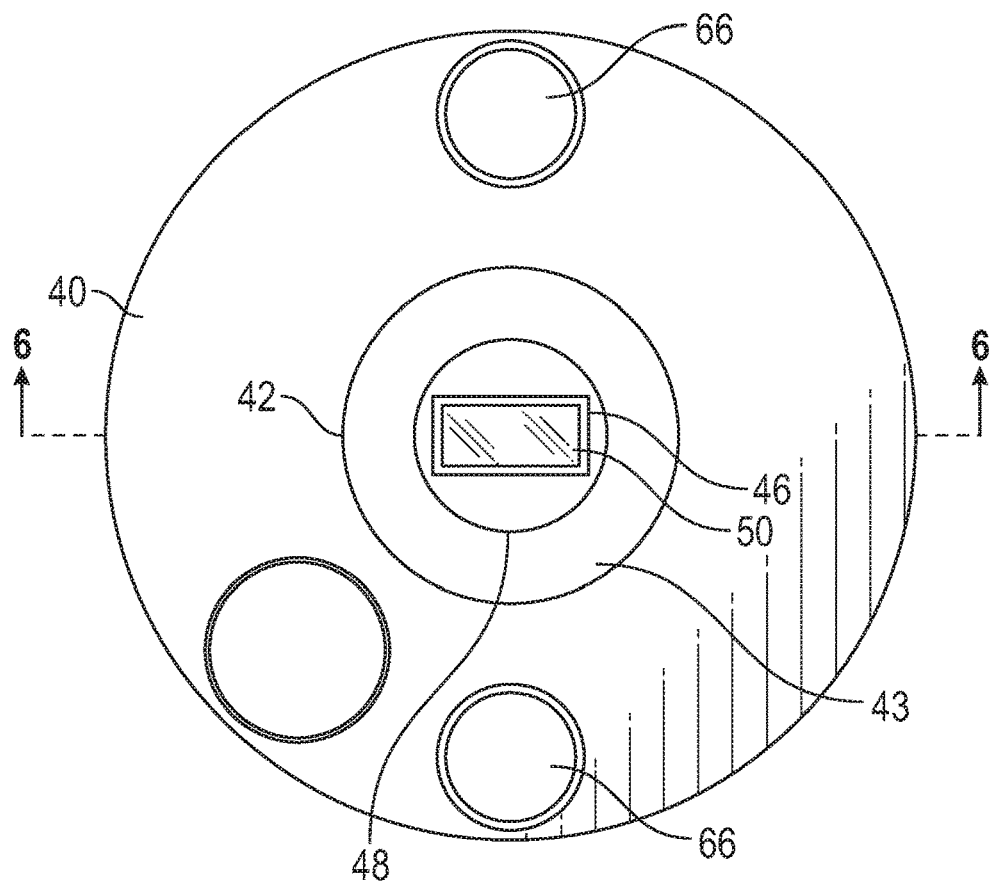
FIG. 5 is a top plan view of the fluid inlet member illustrated in FIG. 2.
Figure 6:
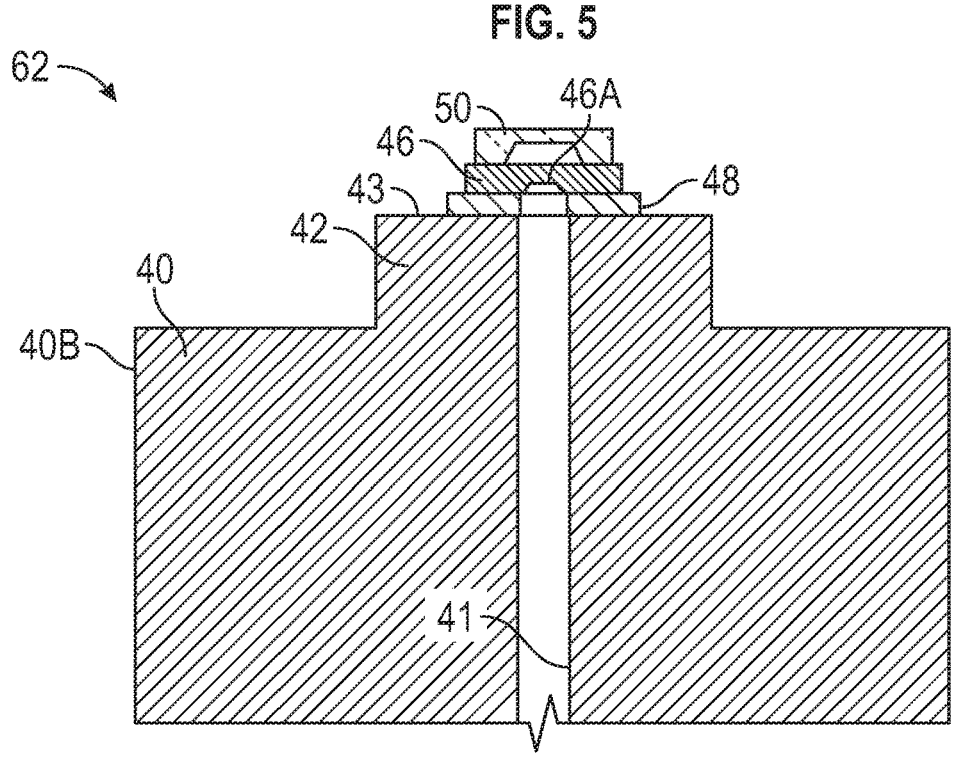
FIG. 6 is a cross-sectional view taken along the line 6-6 of FIG. 5.

As shown in FIGS. 2, 5, and 6, one embodiment of a portion 5 of a superheat controller (SHC) is configured such that the method 70 may be applied thereto. The portion 5 of the SHC shown in FIG. 2 includes the fluid inlet member 40. The fluid inlet member 40 has a first end 40A (the lower end when viewing FIG. 2) and a second end (the upper end when viewing FIG. 2) is similar to a fluid inlet member 18 described below, and includes a substantially cylindrical pedestal 42 formed on a first end of the fluid inlet member 40. The pedestal 42 includes a mounting surface 43. The fluid inlet member 40 includes a central portion 44 that may include external threads. The illustrated fluid inlet member 40 is formed from brass. Alternatively, the fluid inlet member 40 may be formed form other metals, metal alloys, and non-metal materials.

U.S. Pat. No. 9,140,613 discloses a superheat controller (SHC). The SHC disclosed therein is a single, self-contained, stand-alone device which contains all the sensors, electronics, and intelligence to automatically detect a fluid type, such as refrigerant, and report the superheat of multiple common fluid types used in residential, industrial, and scientific applications. U.S. Pat. No. 9,140,613 is incorporated herein in its entirety.

Figure 3:
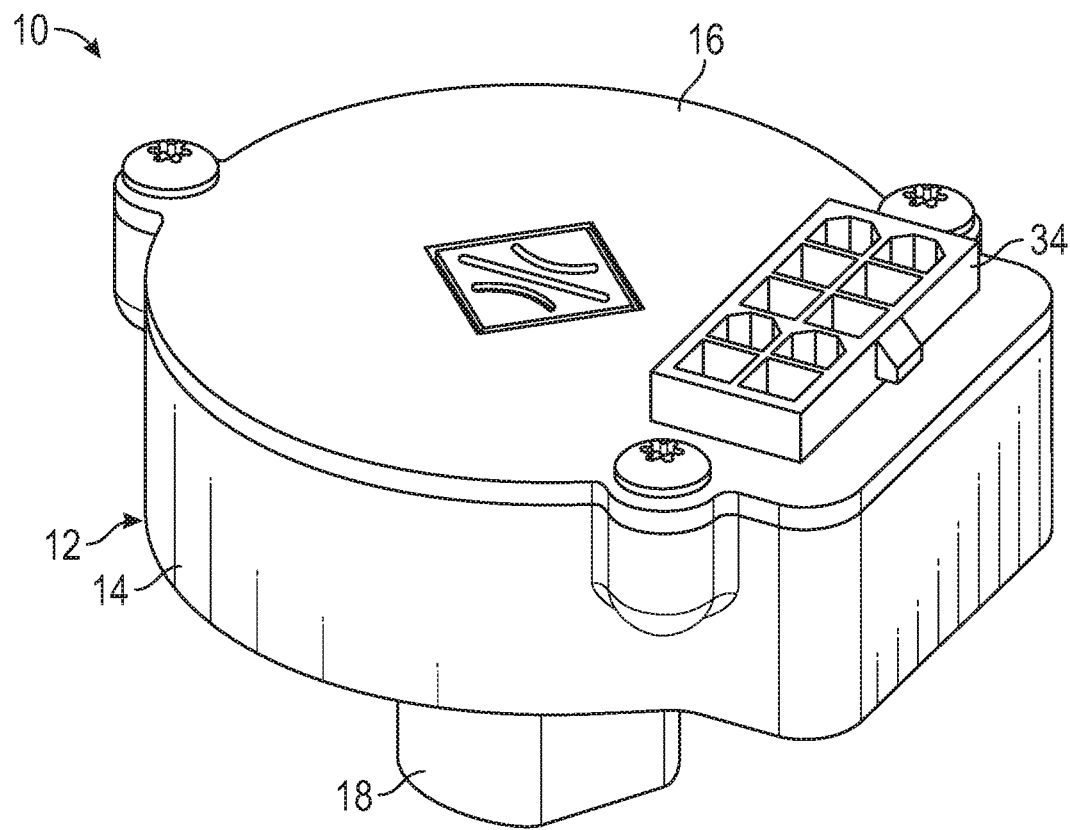
FIG. 3 is a perspective view of a known universal superheat controller.
Figure 4:
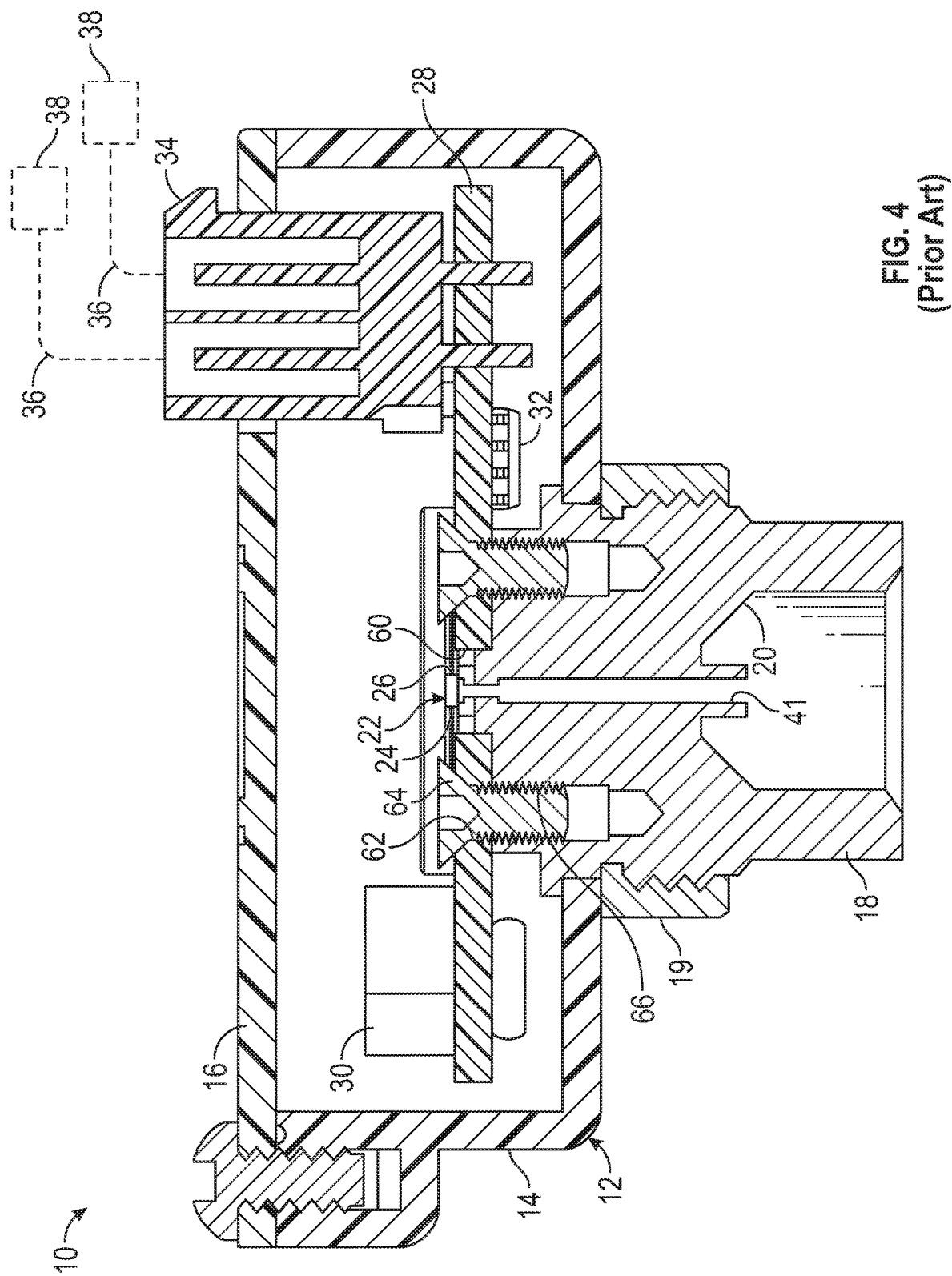
FIG. 4 is a cross sectional view of the known universal superheat controller illustrated in FIG. 3.

FIGS. 3 and 4 herein illustrate a SHC 10, which is similar to the superheat controller disclosed in U.S. Pat. No. 9,140,613. As shown in FIGS. 3 and 4, the illustrated embodiment of the SHC 10 includes a housing 12 having a body 14, a cover 16, and the base that defines the fluid inlet member 18. The fluid inlet member 18 may be secured to the housing 12 by a mounting ring 19. The mounting ring 19 attaches the fluid inlet member 18 to the housing 12 portion by a threaded connection. Alternatively, the mounting ring 19 may be attached to the fluid inlet member 18 by any desired method, such as by welding or press fitting. In the embodiment illustrated in FIGS. 3 and 4, the fluid inlet member 18 is a brass fitting having a centrally formed opening that defines a sealing surface 20.

A first embodiment of a pressure port 41 is formed in the fluid inlet member 40 from the mounting surface 43 of the pedestal 42 to the first end 40A of the fluid inlet member 40 (see FIG. 2). The pressure port 41 is configured as a bore and may convey pressurized fluid to be measured through the fluid inlet member 40, through a hermetic seal defined by solder preform 48, and into a pressure sensing chamber 46A (best shown in FIG. 6) of the pressure sensor die 46, described below.

The SHC 10 illustrated in FIGS. 3 and 4 includes an integrated pressure and temperature sensor 22 having pressure sensor portion 24 and a temperature sensor portion 26 mounted to a printed circuit board (PCB) 28. A superheat processor 30, a data-reporting or communication module 32, and an Input/Output (TO) module 34 are also mounted to the PCB 28. The IO module 34 is a physical hardware interface that accepts input power and reports data through available hard-wired interfaces, such as wires or cables 36, to the superheat processor 30. Target devices 38 that may be connected to the SHC 10 via the IO module 34 may include additional temperature sensors, laptop and notebook computers, cell phones, memory cards, and any device used in or with conventional end of the line test equipment. Alternatively, the target devices 38 may be connected to the communication module 32 by a wireless connection.

The superheat processor 30 is mounted to the PCB 28 and is a high-resolution, high accuracy device that processes the input signals from the pressure and temperature sensor portions 24 and 26, respectively, of the integrated pressure and temperature sensor 22, detects the fluid type, calculates the superheat of the fluid, and provides an output that identifies the level of the calculated superheat. The superheat processor 30 may also be configured to provide other data, such as fluid temperature, fluid pressure, fluid type, relevant historical dates maintained in an onboard memory (such as alarm and on-off history), and other desired information. Advantageously, the superheat processor 30 maintains a high level of accuracy over a typical operating range of pressure and temperature after a one-time calibration. Non-limiting examples of suitable superheat processors include microcontrollers, Field Programmable Gate Arrays (FPGAs), and Application Specific Integrated Circuits (ASICs) with embedded and/or off-board memory and peripherals.

The PCB 28 includes a die aperture 60, and two fastener apertures 62. The PCB 28 may be attached to the fluid inlet member 18 with fasteners, such as threaded fasteners 64 (see FIG. 4) that extend through the fastener apertures 62 and into threaded bores 66 formed in the fluid inlet member 18.

As shown in FIGS. 2 and 6, the pressure sensor die 46 is attached to the pedestal 42 of the fluid inlet member 40 by solder, shown in FIGS. 2, 5, and 6 as the solder preform 48. The pressure sensor die 46 may include a glass cover 50 bonded to an outwardly facing surface thereof (the upwardly facing surface when viewing FIG. 6). A lower surface of the pressure sensor die 46 defines a bonding surface 47 (the downwardly facing surface when viewing FIG. 6). The known solder preform 48 may have any desired shape, and the pressure sensor die 46 may be aligned thereon by an assembler by visual positioning and hand placement, i.e., without the aid of alignment tools.

Referring again to FIGS. 2, 5, and 6, a portion of the fluid inlet member 40 which the method 70 according to the invention may be applied, is shown. As shown, a portion of the pressure port 41 formed through the pedestal 42 has a uniform diameter. In the remaining portion of the fluid inlet member 40, the bore defining the pressure port 41 may have a diameter equal to or larger than the diameter of the portion of the pressure port 41 formed through the pedestal 42.

Referring again to FIG. 1, the improved method for attaching the pressure sensor die 46 to the mounting surface 43 is shown at 70. In a first step 72 of the method 70 a maximum acceptable change in pressure due to mounting stress (dPtarget) transmitted to the pressure sensor die 46 may be determined based on the environment in which the pressure sensor die 46 will be used and through routine experimentation for a selected attachment material (x), described below.

In a second step 74, a worst-case pressure difference transfer function of the attachment material (x) over a thickness (h) variation is determined using the equation: $dPmax_x = h*B_x + C_x$, wherein B=pressure variation/thickness (h), and C=pressure variation.

The transfer function for a specific attachment material (x) may be derived from measured pressure data at a minimum of two different attachment material thicknesses (h) having the same geometric shape, e.g., circular, rectangular, and the like. Environmental factors or influences such as mounting torque and operation temperature may be varied within known limits, such as within about 50 in-lbs. to about 150 in-lbs. (about 5.65 Nm to about 16.95 Nm) and within about −40° C. to about 100° C., to find both the minimum measured pressure (Pmin) and the maximum measured pressure (Pmax) at each thickness (h) are then used to derive the worst-case pressure difference transfer function $(dPmax_x = h*B_x + C_x)$ for a given material (x) and geometric shape.

It will be understood that the first step 72 may occur prior to the second step 74, the second step 74 may occur prior to the first step 72, or the first and second steps 72 and 74 may occur concurrently.

In a third step 76, dPtarget may be substituted for dPmax in the attachment material's derived pressure difference transfer function and the equation may then be solved for h, thus $h = (dPtarget - C_x)/B_x$.

In a fourth step 78, the pressure sensor die 46 may be attached to the pedestal 42 using attachment material (x) having the thickness (h) or greater, as calculated in the third step 76.

The specific pressure difference transfer function equation used may vary depending on the physical characteristics of the selected attachment material (x), the geometric shape of the selected attachment material (x), and the assembly process used to mount the pressure sensor die 46 to the mounting surface 43 of the pedestal 42.

Conventional computer-based equation solver applications, also known as "curve fitters," may be used to generate a best data fit. Typically, these curve fitter applications process tabular user data, such as dPmax, collected over multiple variables, including but not limited to the attachment material (x), thickness (h), mounting torque and operation temperature, and provide an equation that describes or fits the behavior of the dependent variable.

The attachment material (x) may be any suitable attachment material, including but not limited to solder paste, solder preform, thick solvent-resistant adhesives, and epoxy. When the attachment material (x) selected is either solder paste or solder preform, the solder paste or solder preform may be melted and then solidified to form a thick attachment layer of solder using a conventional solder re-flow operation.

Preferably, the attachment material (x) is solder. The solder may be selected such that, after being used to attach the pressure sensor die 46 to the mounting surface 43 of the pedestal 42, a layer of attachment material (x) is formed that has a thickness within the range of about 0.0025 inches to about 0.008 inches (63 μm to about 203 μm). Alternatively, the layer of attachment material (x) may a thickness less than about 0.0025 inches (63 μm) or greater than about 0.008 inches (203 μm).

If the attachment material (x) is an epoxy, then the epoxy may have a thickness of up to about 0.04 inches (1.0 mm). Alternatively, the layer of attachment material (x) may a thickness greater than about 0.04 inches (1.0 mm).

Additionally, the attachment material (x) may be selected such that, after being melted to attach the pressure sensor die 46 to the mounting surface 43, a solder layer is formed that is sufficiently ductile such that it is effective to reduce the transmission of stresses by the material height or thickness (h) calculated in the third step 76. Examples of suitable solder based attachment materials include, but are not limited to a ductile, relatively low-temperature RoHS solder such as $Sn_{96}Ag_4$, $Sn_{95}Ag_5$, $Sn_{95}Sb_5$, $Sn_{77}In_{20}Ag_3$, and $Sn_{87}In_{10}Ag_3$ solder materials.

Preferably, a low-temperature solder material with Indium or Bismuth content may be used. Further, other solder material having a ductile-to-brittle transition (DBTT) below about −40 C, or solder material that has good, i.e., desired, fatigue characteristics. It will be understood that DBTT may be determined using a conventional Charpy impact test.

As described herein above, a thick, ductile solder joint may be used to attach the pressure sensor die 46 to the mounting surface 43. This thick, ductile solder joint defines an attachment layer that advantageously mechanically isolates the pressure sensor die 46 from stress in the mounting surface 43.

It is known that some materials (x) that have excessive volumetric temperature coefficient of expansion (TCE) and/or odd hysteresis characteristics. As is known, TCE may be measured in ppm/° C., wherein ppm represents a parameter of interest, such as the thicknesses (h). For example, attachment materials (x) with very large thicknesses (h) may exacerbate residual pressure variation over temperature. Thus, dissimilar temperature expansion (or mismatch) of materials, which would otherwise result in undesirable stress and a measurable and undesirable change in pressure, may be identified and avoided by the method of the invention 70, wherein an optimum thickness (h) is determined by the equation $h=(dPtarget-C_x)/B_x$. Additionally, differences between the TCE of the material of a base, e.g., the fluid inlet member 40, and the TCE of the material of an attached MEMS pressure die, e.g., the pressure sensor die 46, may be mitigated by the type and thickness of the chosen attachment material (x).

Additionally, the method of the invention 70 uses real-world data and conforms to real-world results, rather than the results of a conventional simulation. The method 70, and the equations associated therewith, thus fit or conform to actual physical results rather than potentially erroneous results from conventional simulations. The necessary performance characteristics for a specific attachment material (x) and geometric shape thereof are gathered and used to determine thickness (h). Thus, only the final attachment material (x) thickness (h) choice requires validation.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A method of attaching a MEMS pressure sensor die to a base, the method comprising:
   selecting an attachment material (x), wherein the attachment material is one of solder paste and solder preform;
   determining a maximum change in pressure due to mounting stress (dPtarget) transmitted to a MEMS pressure sensor die based on factors of an environment in which the MEMS die is used, wherein the factors of the environment include mounting torque within the range of about 50 in-lbs. to about 150 in-lbs. and operation temperature within the range of about −40° C. to about 100° C.;
   determining a worst-case pressure difference transfer function of the attachment material (x) over a thickness (h) variation of the attachment material (x) using the equation:

$dPmax_x = h*B_x + C_x$, wherein B=pressure variation/thickness (h), and C=pressure variation;

substituting dPtarget for $dPmax_x$ in the pressure difference transfer function and solving the equation for h, wherein $h=(dPtarget-C_x)/B_x$; and
   attaching the MEMS pressure sensor die to a threaded base using only the selected attachment material (x) having at least the calculated thickness (h), thereby reducing torque-induced stress in the base that is transmitted through the attachment material (x) to the MEMS pressure sensor die;
   wherein the attachment material may be melted and then solidified to form a thick attachment layer of solder using a solder re-flow operation; and
   wherein the thick attachment layer of solder defines a ductile solder joint that is configured to mechanically isolate the MEMS pressure sensor die from stress in the base to which the MEMS pressure sensor die is attached.

2. The method according to claim 1, wherein the transfer function for the selected attachment material is derived from measured pressure data at a minimum of two different attachment material thicknesses.

3. The method according to claim 2, wherein each of the two different attachment materials have the same geometric shape.

4. The method according to claim 3, wherein the step of determining a worst-case pressure difference transfer function includes varying factors of the environment to determine a minimum measured pressure and a maximum measured pressure at each of the minimum of two different attachment material thicknesses.

5. The method according to claim 1, wherein the steps of determining a maximum acceptable change in pressure and determining a worst-case pressure difference transfer function of the attachment material may occur concurrently.

6. The method according to claim 1, wherein the step of determining a worst-case pressure difference transfer function of the attachment material may occur prior to the step of determining a maximum acceptable change in pressure.

7. The method according to claim 1, wherein the attachment layer formed has a thickness within the range of about 0.0025 inches to about 0.008 inches (63 μm to about 203 μm).

8. The method according to claim 1, wherein the one of solder paste and solder preform is formed from ductile, low-temperature RoHS solder.

9. The method according to claim 8, wherein the solder is one of $Sn_{96}Ag_4$, $Sn_{95}Ag_5$, $Sn_{95}Sb_5$, $Sn_{77}In_{20}Ag_3$, and $Sn_{87}In_{10}Ag_3$ solder.

10. A method of attaching a MEMS pressure sensor die to a base, the method comprising:

selecting an attachment material (x), wherein the attachment material is one of solder paste and solder preform;

determining a maximum change in pressure due to mounting stress (dPtarget) transmitted to a MEMS pressure sensor die based on factors of an environment in which the MEMS die is used, wherein the factors of the environment include mounting torque within the range of about 50 in-lbs. to about 150 in-lbs. and operation temperature within the range of about −40° C. to about 100° C.;

determining a worst-case pressure difference transfer function of the attachment material (x) over a thickness (h) variation of the attachment material (x) using the equation:

$dPmax_x = h*B_x + C_x$, wherein $B$=pressure variation/thickness ($h$), and $C$=pressure variation;

substituting dPtarget for $dPmax_x$ in the pressure difference transfer function and solving the equation for h, wherein $h=(dPtarget-C_x)/B_x$; and attaching the MEMS pressure sensor die to a base using only the selected attachment material (x) having at least the calculated thickness (h);

wherein the attachment material may be melted and then solidified to form a thick attachment layer of solder using a solder re-flow operation; and wherein the thick attachment layer of solder defines a ductile solder joint that is configured to mechanically isolate the MEMS pressure sensor die from stress in the base to which the MEMS pressure sensor die is attached;

wherein the transfer function for the selected attachment material is derived from measured pressure data at a minimum of two different attachment material thicknesses;

wherein each of the two different attachment materials have the same geometric shape; and wherein the step of determining a worst-case pressure difference transfer function includes varying the factors of the environment to determine a minimum measured pressure and a maximum measured pressure at each of the minimum of two different attachment material thicknesses.

* * * * *

UNITED STATES PATENT AND TRADEMARK OFFICE
CERTIFICATE OF CORRECTION

PATENT NO. : 10,640,374 B2
APPLICATION NO. : 15/896796
DATED : May 5, 2020
INVENTOR(S) : Wayne C. Long et al.

Page 1 of 1

It is certified that error appears in the above-identified patent and that said Letters Patent is hereby corrected as shown below:

In the Specification

Column 3, Line 22, change:
"and an Input/Output (TO) module 34 are also mounted to the"
To:
--and an Input/Output (IO) module 34 are also mounted to the--

Signed and Sealed this
Eighteenth Day of August, 2020

Andrei Iancu
*Director of the United States Patent and Trademark Office*